United States Patent
Langston et al.

[11] Patent Number: 6,051,344
[45] Date of Patent: Apr. 18, 2000

[54] MULTIPLE REDUCTION PHOTOLITHOGRAPHY TECHNIQUE

[75] Inventors: Joseph C. Langston, Los Altos, Calif.;
Patrick M. Troccolo, Portland, Oreg.

[73] Assignee: Intel Corporation, Santa Clara, Calif.

[21] Appl. No.: 09/049,828

[22] Filed: Mar. 27, 1998

Related U.S. Application Data

[62] Division of application No. 08/877,128, Jun. 17, 1997, abandoned.

[51] Int. Cl.⁷ .................................................. G03F 9/00
[52] U.S. Cl. ................................................................ 430/5
[58] Field of Search ............................ 430/5, 322, 394; 355/53

[56] References Cited

U.S. PATENT DOCUMENTS

| | | | |
|---|---|---|---|
| 4,696,878 | 9/1987 | Shimkunas | 430/5 |
| 4,855,197 | 8/1989 | Zapka et al. | 430/5 |
| 5,153,898 | 10/1992 | Suzuki et al. | 378/34 |
| 5,260,151 | 11/1993 | Berger et al. | 430/5 |
| 5,399,448 | 3/1995 | Nagata et al. | 430/5 |
| 5,424,154 | 6/1995 | Borodovsky | 430/5 |
| 5,437,946 | 8/1995 | McCoy | 430/5 |
| 5,552,247 | 9/1996 | Waldo, III et al. | 430/5 |

*Primary Examiner*—S. Rosasco
*Attorney, Agent, or Firm*—Naomi Obinata

[57] ABSTRACT

A photolithography method for creating very small line dimensions includes making a mask by exposing a mask blank through a reticle in a reduction photolithography exposure tool, at a reduction of N. The fabricated mask is then placed in a second photolithography exposure tool at a second reduction M, to expose a wafer substrate at a reduction of M. The resulting patterned substrate will have a critical dimension equaling the critical dimension of the original reticle, divided by the factor N times M. In this manner, very small size patterns can be created even though a larger pattern starting reticle is used.

6 Claims, 5 Drawing Sheets

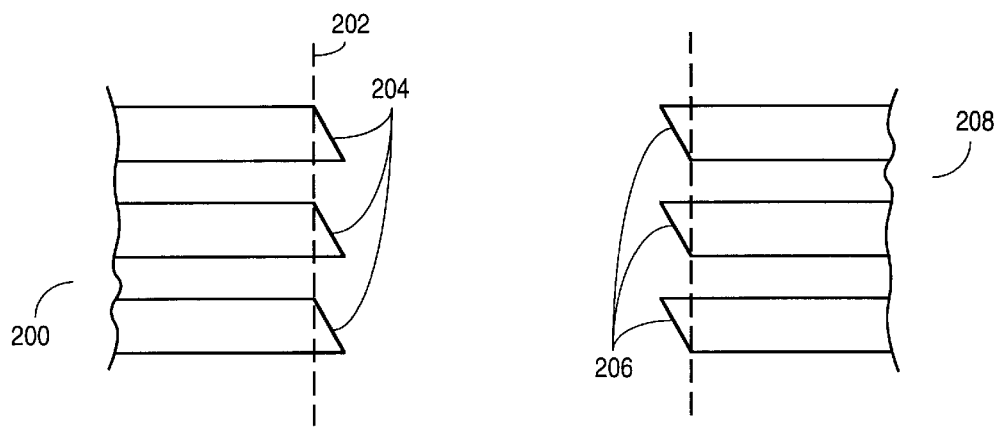
FIG. 6  FIG. 7
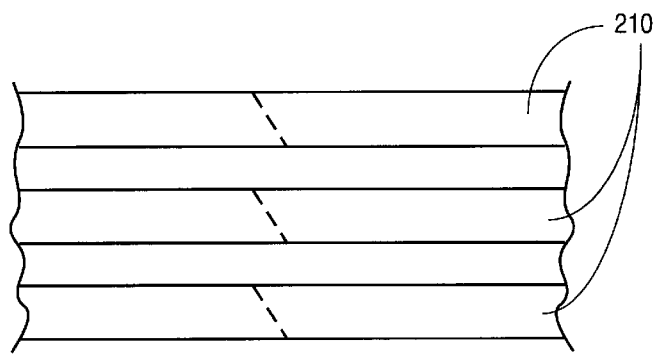
FIG. 8

MULTIPLE REDUCTION PHOTOLITHOGRAPHY TECHNIQUE

This application is a divisional of application Ser. No. 08/877,128 filed Jun. 17, 1997, now abandoned.

FIELD OF THE INVENTION

This invention is in the field of semiconductor processing. More specifically, this invention relates to a method of photolithography using multiple reductions to make a very small pattern on a substrate.

BACKGROUND OF THE INVENTION

A critical step in semiconductor processing is photolithography. The ability to achieve smaller and smaller dimensions on an integrated circuit is generally understood to be limited more by photolithography than any other fabrication step of the semiconductor process. As the industry heads toward forming 0.1 micron (um) line dimensions, advanced photolithographic capabilities become ever more critical. Various new photolithographic techniques using smaller wavelength light sources are being developed; and Deep Ultra Violet regime, Extreme Ultra Violet Lithography (EUVL) also known as "soft x-ray" lithography, typically at a light wavelength of approximately 5–25 nanometers (nm), and x-ray lithography are examples of development areas. Even if commercially viable photolithography systems at the shorter wavelengths are developed, these methods, cannot be successful unless masks can be developed for them. Hence, the photolithography mask (hereafter "photomask") itself is at risk of being a technology limitation to achieving 0.1 um line widths.

The conventional method of forming a photomask starts with a reticle blank. The reticle may be made of glass or other materials such as quartz, and the material is usually transparent to the wavelength of light to be used in the photolithography system. The substrate blank is coated with an absorbing material to-be-patterned; the absorber is usually chrome, but can also be made of aluminum, tungsten, tantalum or titanium. A coating of photoresist is formed over the top of the absorbing material. The reticle is then placed in a patterning system, usually a direct electron beam or laser writing system. The writing system beam scans across the photoresist in an automated pattern, in accordance with data fed from a preprogrammed database of patterning instructions for an integrated circuit layer. After the pattern has been written into the photoresist, the photoresist is developed. Then, the absorber layer on the reticle is patterned by wet or dry etching the open areas of the photoresist created by photoresist development. Then, any remaining photoresist is removed. The reticle is inspected for defects, and defects are repaired. The reticle is then ready for use.

The pattern of the reticle is usually created in larger dimensions than the dimensions of the pattern to be made on the silicon wafer substrate because a reduction photolithography system is used, that is, one that has reducing optics. A typical reduction factor in today's photolithography systems is 4. Thus, if the desired pattern on the silicon wafer substrate has a minimum dimension of 0.4 um, then the starting reticle will be patterned at a minimum dimension of 1.6 um.

Having a starting reticle at a minimum dimension of 1.6 um is considered manufacturable today because line patterns, dimensions, defect levels and the ability to repair defects fall within today's normal manufacturing tolerances. A way to achieve smaller substrate patterns is, of course, to reduce the reticle line width. The problem with reducing reticle line width is in its manufacturability. Even if line widths are reduced on the direct write beam, the manufacturing defects seen at the larger widths are still present, creating the effect of magnified defects. Magnified defects take a freshly written reticle out of manufacturing tolerances, leading to lower reticle yields and therefor increased costs.

What is needed is a maskmaking technique that is manufacturable and useful for patterning substrates in small dimensions such as 0.1 um. It would be advantageous to be able to use presently characterized and understood fabrication techniques in maskmaking.

BRIEF DESCRIPTION OF THE DRAWINGS

FIG. 6 is a top view illustration of line pattern edges on a mask as they may appear at the edge of a first field segment.

FIG. 7 is a top view illustration of line pattern edges on a mask as they may appear at the edge of a second field segment.

FIG. 8 is a top view illustration of line pattern edges on a mask stitched together following exposures of first and second field segments.

SUMMARY OF THE INVENTION

A method of exposing a substrate in photolithography is described. A reticle having a first critical dimension is provided. A mask blank is exposed using the reticle at a first reduction, to form a patterned mask at a second critical dimension. A substrate is then exposed using the patterned mask at a second reduction, to form a patterned substrate at a third critical dimension. A method of forming a mask field is also described. A reticle having a pattern is divided into a plurality of segments. The segments are used to expose a mask blank in a plurality of steps. Each step creates a pattern transfer of one of the segments onto the mask. Each segment is aligned with an edge of an adjacent segment to create a substantially continuous pattern in a field.

DETAILED DESCRIPTION OF THE INVENTION

The present invention is a multiple reduction photolithography technique for exposing a substrate at a reduced line dimension. The invention addresses the need for creating a manufacturable substrate patterning capability in spite of the limitations of conventional direct write techniques for making the starting reticle. To aid in the description of the embodiments of the present invention, the following language rules are provided. "Conventional" and like terms here refer to that which is known in the art at the time the invention is used. "Reticle" here refers to the initial mask used in the process of the invention having an original, larger critical dimension. "Critical dimension" is referred to here to mean the minimum cross-sectional width of a pattern feature. The subsequently formed mask from the reticle, at a smaller critical dimension, will be referred to as a "mask". A still subsequently formed patterned substrate at an even smaller critical dimension will be referred to as "substrate". "Substrate" may be a silicon wafer or another substrate on which integrated circuits or micromechanical structures are fabricated.

A description of several embodiments of the present invention is provided below, including details offered as an aid for illustrating the invention; however, the details are offered to aid in the understanding of invention only and are not to be construed as limiting the elements of the basic invention.

The basic invention, which is described in more detail below, is a technique for creating a pattern in a mask, and then a pattern in a substrate, using reduction techniques. The basic tools for using the invention are a reticle, a substrate for forming a mask, and a substrate onto which a final pattern is to be formed, and a photolithography system or systems for exposure. Embodiments of the invention are described in parts; the overall flow of a double reduction method, and then descriptions of the reticle, masks, and stepping and scanning methods for the mask.

Figure 1:
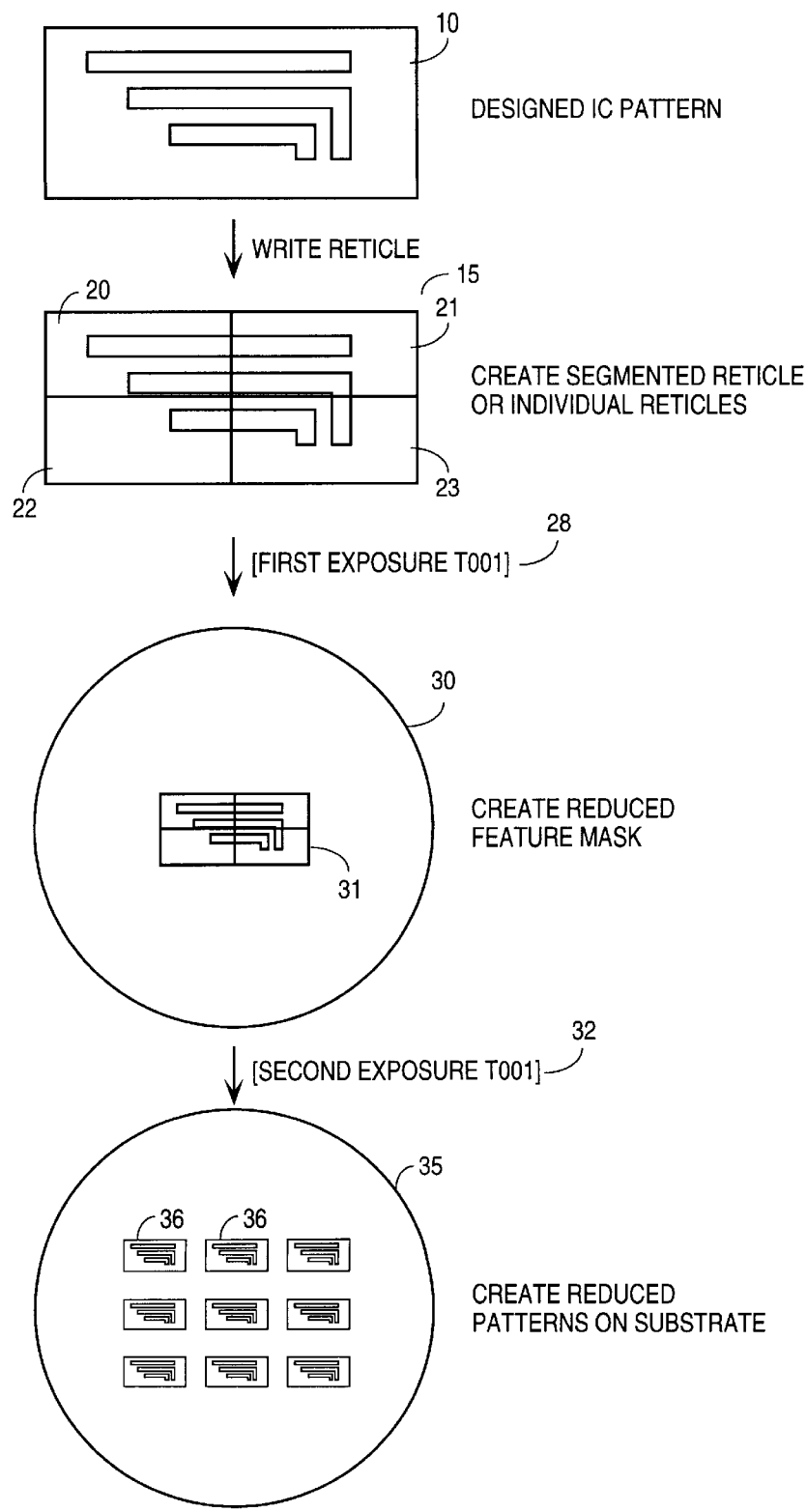
FIG. 1 is an illustration of a flow for conducting an embodiment of the present invention.

FIG. 1 illustrates a flow of an embodiment of the present invention. The starting point is a design for an integrated circuit pattern 10. The design is written onto a reticle 15. Reticle 15 is shown to be divided into field segments 20, 21, 22, 23 to create separate individual reticles, or a single reticle. In the embodiment of FIG. 1, a single reticle 15 is shown. An electron beam, laser or other illumination source is used to write design 10 onto segments 20, 21, 22, 23 of reticle 15. Next, reticle 15 is placed in a photolithography exposure tool 28 so that the pattern that has been written into each segment 20, 21, 22, 23 of reticle 15 is transferred to a mask blank 30. Photolithography exposure tool 28 can be any conventional stepper, scanner or other exposure tool. An example of photolithography exposure tool 28 is a deep ultra violet wavelength stepper at 248 nanometers. Exposure tool 28 is at a reduction of N, where N is an integer. In the example here, N is approximately 4. The pattern transferred onto mask blank 30 from reticle 15 is a replica of the pattern of reticle 15 but reduced by a factor of N. Preferably, segments 20, 21, 22, 23 are exposed individually and separately and the edges of each segment 20, 21, 22, 23 are aligned and abutted to stitch together the edges of the pattern transferred onto mask blank 30. Next, mask blank 30, now having a reduced pattern, is placed in a second photolithography exposure tool 32. Second exposure tool 32 can be any pre-selected exposure tool but in this embodiment it is preferably an EUVL system operating at a wavelength of approximately 13 nm. The pattern of mask 30 is transferred to a substrate 35 at a reduction of M, where M is an integer, M being either different from or the same value as N. The substrate pattern 36 on substrate 35 is a replica of the pattern of reticle 15, but at a reduction of M. Compared with the pattern of reticle 15, substrate pattern 36 is reduced by N times M. In other words, if Ps is the pattern size of substrate pattern 36, and Pr is the pattern size of reticle 15, then Ps=Pr/(N×M), where and N and M are the reduction factors of the first and second photolithography systems 28 and 32.

Figure 2:
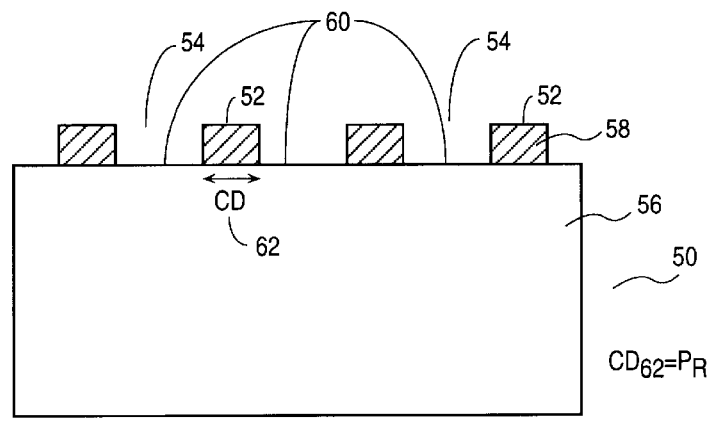
FIG. 2 is a cross-sectional view illustration of a conventional reticle for use in a presently-known photolithography system. A conventional reticle is useful for patterning presently manufactured linewidths; it can also be used as an embodiment of the invention, to create a pattern in a mask blank.

Referring to FIG. 2, showing a cross sectional view of a typically used conventional patterned reticle 50, there are opaque portions 52 and transmissive portions 54. Patterning of reticle 50 starts with a substrate 56 made of glass or quartz. Substrate 56 contains a film of absorber 58, made of light absorbing material such as chromium in the case of 248 nm wavelength wafer exposure system. A pattern is made in absorber 58 by first coating absorber 58 with photoresist and writing a pattern into the photoresist with a direct write electron beam, laser, or any other illumination source capable of defining patterns of the desired dimension in the photoresist (not shown). The photoresist is developed to expose areas in absorber 58 and then absorber 58 is etched to create openings 60 where photoresist did not cover absorber 58. The combination of openings 60 and remaining absorber 58 form the pattern in reticle 50. The critical dimension 62, that is, minimum line width, in absorber 58, is pre-selected to be the minimum dimension desired for the to-be-patterned substrate, multiplied by the reduction factor of the photolithography system being used. For example, if the reduction N at exposure in the photolithography system is 4, and the to-be-formed patterned mask is to be 0.4 um critical dimension, then critical dimension 62 for reticle 50 is 0.4 um×4 which is 1.6 um. Reticle 50 may be divided into segments as in segments 20, 21, 22, 23 of FIG. 1, to enable multiple exposures and stitching to allow for a mask to be formed with a field that is larger than the focal point of the light source used (to be described more fully below).

Figure 3:
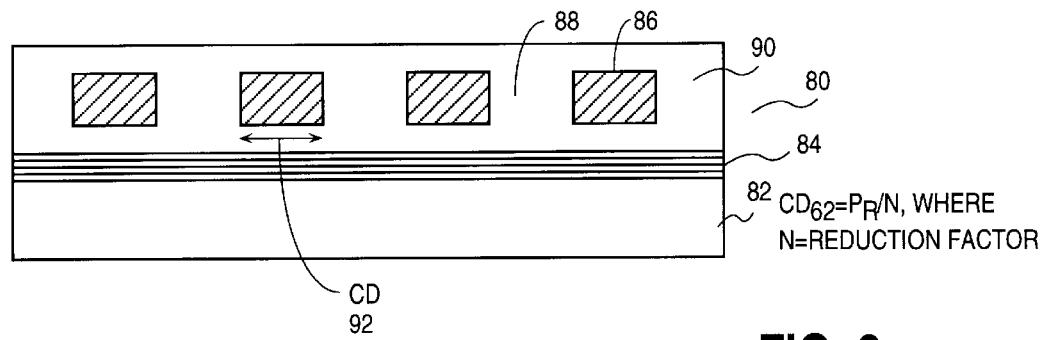
FIG. 3 is a cross-sectional view illustration of an embodiment of a mask blank created by a conventional reticle.
Figure 4:
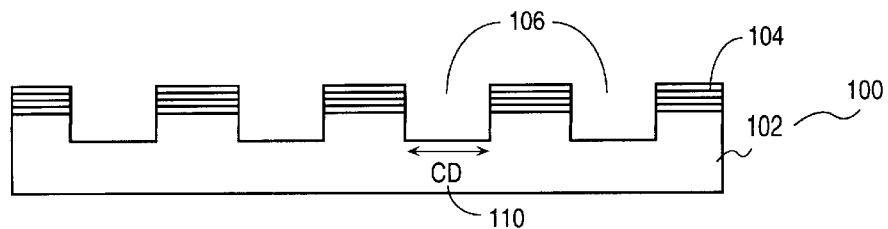
FIG. 4 is a cross-sectional view illustration of another embodiment of a mask blank created by a conventional reticle.

FIGS. 3 and 4 illustrate an enlarged cross-sectional view of an example mask 80, 100, respectively, to be made using reticle 50 of FIG. 2. The mask structure to be created in this step of the invention should be selected to deal effectively with defects at a reduced line width. A preferred structure is one that can be fabricated using adopted silicon fabrication processing techniques. For example, mask 80 is formed on a substrate 82 by patterning substrate 82 using a conventionally made reticle such as reticle 50 of FIG. 2, in a conventional photolithography exposure tool. Substrate 82 generally is made of a material that can be either transparent or reflective to the to-be-used light wavelength in the photolithography system in which mask 80 will be used. In the case of EUVL, substrate 82 is preferably silicon, and can be in the form of a silicon wafer. For a reflective EUVL system, substrate 82 preferably contains a resonant reflective layer 84. Resonant reflective layer 84 is preferably made of alternating thin films of transmissive material, such as silicon, and reflective material, such as molybdenum, at pre-selected thicknesses to create resonant reflectance for the wavelength of light being used. In the case of light at approximately 13 nm wavelength, the preferred thickness of each layer is 40–100 angstroms, and approximately 40 film layers of each material are used to make resonant reflective layer 84.

Further in FIG. 3, the mask structure contains absorbing portion 86 held within trenches 88 that have been formed partly through a structure layer 90 made of silicon or other transmissive material. Absorbing portions 86 are made of metallic or other material absorptive to the wavelength of light to be used for mask 80. In the case of light at approximately 13 nm wavelength, absorbing portions 86 are preferably aluminum, tungsten, tantalum or titanium. Structure layer 90 is preferably silicon for EUVL at 13 nm wavelength. Structure layer 90 needs to be thick enough to create the needed structural integrity for holding absorbing portions 86, but at the same time needs to be thin enough to be transmissive to the applied light wavelength within a pre-determined tolerance level for needed transmissivity. The top surface of structure layer 90 and absorbing portions 86 is planarized to make a substantially smooth and planar surface to mask 80. A portion of structure layer 90 preferably resides over the surface of mask 80 including over absorbing portions 86 to create a protective cap. Mask 80 is fabricated using a combination of masking, etching, filling and planarizing deposited structure layer 90 and absorbing layer 86. The critical dimension 92 of mask 80 is the critical dimension of the reticle used for making the mask, for example, critical dimension 62 of reticle 50 of FIG. 2, reduced by a factor of N. Thus, if critical dimension 62 of reticle 50 of FIG. 2 is 1.6, then critical dimension 92 of mask 80 is 1.6 um÷4, which is 0.4 um. No matter what technique is used to fabricate a mask, it is important to select a maskmaking process that allows for reduced defects or reduced impact of defects that occur, and ability to repair defects that occur to ensure that the mask is within manufacturing tolerances of the user of the invention.

FIG. 4 illustrates an alternative embodiment of a reflective mask. Mask 100 shown in FIG. 4 contains a resonant reflective layer 104 similar to that shown in FIG. 3. There is a substrate 102, made of material that is transmissive to the wavelength of light to be used. Again, for EUVL, substrate 102 is preferably silicon and can be in the form of a silicon substrate. Substrate 102 contains a resonant reflective layer 104, which in this example is similar in structure as resonant reflective layer 84 described above. In lieu of absorbing portions as described above, however, resonant reflective layer 104 contains trench openings 106 that extend through resonant reflective layer 104 and into a portion of substrate 102. The depth to which resonant reflective layer 104 may extend may range from just at the bottom of reflective layer 104 to nearly the entire depth of substrate 102, depending on the reliability of the process used to open trenches 106 and any other manufacturing issues. Trenches 106 are created by first patterning a layer of photoresist (not shown), using a reticle such as reticle 50 (FIG. 2), in a conventional reduction photolithography exposure tool. Then, portions of resonant reflective layer 104 are plasma etched to make trenches extending through reflective layer 104. When light at approximately 13 nm wavelength is applied to mask 100, the light reflects off resonant reflective layer 104 and transmits through openings 106. Because the mask for EUVL is reflective, the portions that are to be distinct from the reflective portions can be either absorbing or transmitting. In the case of mask 80 of FIG. 3, those portions distinct from the reflective portions are transmitting. In the case of mask 100 of FIG. 4, those distinct portions are transmitting. The critical dimension 110 of mask 100 is the critical dimension of the reticle, for example, critical dimension 62 of reticle 50 of FIG. 2, reduced by a factor of N. Thus, if critical dimension 62 of reticle 50 of FIG. 2 is 1.6, then critical dimension 110 of mask 100 is 1.6 um÷4, which is 0.4 um. As in the case of mask 80 of FIG. 3, no matter what technique is used to fabricate mask 100 or another mask for the present invention, it is important to select a maskmaking process that allows for reduced defects or reduced impact of defects that occur, and ability to repair defects that the mask is within manufacturing tolerances of the user of the invention.

Figure 5:
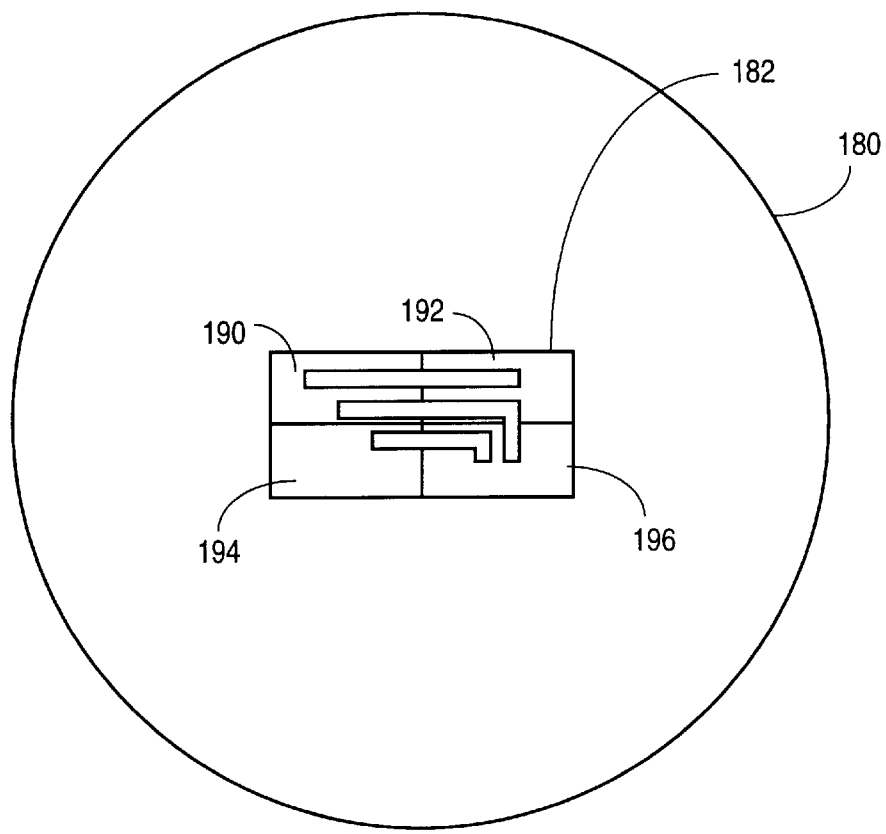
FIG. 5 is a top view illustration of an embodiment of a patterned mask blank which has been divided into field segments.

FIG. 5 illustrates a top view of a post-exposure mask 180 following exposure to reticle 50 (FIG. 2). The pattern of mask 180 is within a field 182. Field 182 in this example is divided into four segments 190, 192, 194, 196. Segments 190, 192, 194 and 196 are present if the size of field 182 is larger than the size of the focal point of the beam of light from the exposure tool transferring the pattern from reticle 50 of FIG. 2 to mask 180. The pattern in field 182 is created by forming segments 190, 192, 194 and 196 separately in repeated exposures using different reticle segments. The reticle segments can be segments within a single reticle, or may be themselves individual reticles. More specifically, for example, separate reticles made from separate segments 20, 21, 22, 23 of FIG. 1, each containing the pattern for segment 190, 192, 194, 196, respectively, are placed individually in an exposure tool, aligned, and exposed. Each segment 20, 21, 22, 23 (FIG. 1) contains parts of a pattern that, when fitted together at the edges, the pattern is "stitched" to create a continuum within field 182. More specifically, the pattern segment 20 (FIG. 1) is placed within an exposure tool and exposed onto field 182 in the desired location for segment 190. Segment 20 (FIG. 1) is removed from the exposure tool, and then pattern segment 21 (FIG. 1) is placed within the exposure tool and aligned with field 182 so that the pattern of segment 21 (FIG. 1) is fitted with segment 190. Segment 192 is then formed by exposing the aligned segment 21 over field 182. Proper alignment of segments 20 and 21 with respect to the preset locations for segments 190 and 192 allow the edges of the pattern to stitch together. Note that manufacturing tolerances need to be built into the mask design to account for potential errors in alignment and stitching.

FIGS. 6–8 illustrate examples of types of line shapes that may be created on mask 180 of FIG. 5. In FIG. 6, a set of lines 200 is shown at a border 202 of segments 190, 192 within mask field 182 of mask 180 in FIG. 5. Lines 200 contain edges 204 that are slanted downward at an angle of about 45 degrees or less from vertical, preferably in the range of 20 to 45 degrees. In FIG. 7, edges 206 of lines 208 are slanted upward preferably at an angle matching the slant of lines 200 of FIG. 6. By exposing each segment 190, 192 separately using either different reticles or reticle segments and aligning each segment 190, 192 together at border 202, the effect of a stitch is made and line pattern 200 and 208 appear as a continuous line 210 as in FIG. 8. To average out alignment or reticle defect or other errors, a "voting" technique can be used during exposures of segments 190, 192. In voting, the reticle is positioned over the substrate, a partial exposure is done, the reticle is removed and replaced in the same location, another partial exposure is done, and the process is repeated until a full exposure is made. If necessary, each partial exposure is done at varied dosage. To attain the needed precision to stitch together segments 190, 192 to create a desired smooth line pattern 210 out of separate line 200 and 208, a voting technique is preferably used as the exposure process for each segment 190, 192.

Figure 9:
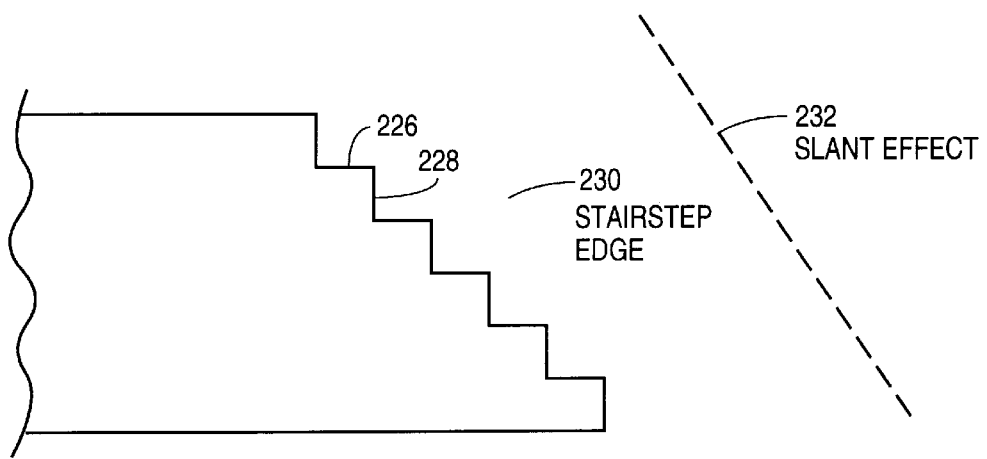
FIG. 9 is a top view illustration of a line slant edge as may appear on a reticle, to demonstrate an embodiment of how a line slant edge can be created using conventional reticle writing techniques.

FIG. 9 illustrates in magnified view an embodiment of line shapes on a reticle to create the slant effects of lines 200 and 208 of FIGS. 6 and 7. It is usually difficult using conventional electron beam or laser direct writing techniques (not shown) to create a slanted line by diagonal beam movement because the beam movement is generally limited to the x (side-side) and y (up-down) directions only. However, the effect of a slant 232 can be made by moving the beam in small increments of x and y directions, to create small lines 226, 228 in x and y directions to create a stair step edge 230 to create the overall effect of a slant 232.

After mask 180 as in FIG. 5 is formed, mask 180 is then used to pattern a substrate, at a second reduction (which can be the same reduction factor as the first reduction). Patterning the wafer substrate uses known methods of coating the substrate with photoresist, and exposing the substrate in a photolithography system using mask 180 of FIG. 5, and etching a pattern in the substrate through the exposed photoresist. If the starting reticle has a critical dimension of 1.6, and is used at a reduction factor of 4 to create mask 180 at critical dimension of 0.4 um, and then mask 180 is placed in a photolithography system having a reduction factor of 4, then the patterned substrate critical dimension will be 0.1 um. Thus, through a sequence of steps of forming a reticle at a higher critical dimension, using the reticle to form a mask at a reduced critical dimension, and then using the mask to form a patterned substrate at a further reduced dimension, the sought-after, ultra small critical dimension on the scale of 0.1 um on a substrate can be achieved.

A multiple reduction technique to form a pattern on a substrate has been described. The technique also discloses a step and repeat sequence for forming a mask in segments from a reticle. Details have been disclosed to aid in the understanding of the invention, however, certain other details have not been included to avoid unnecessarily obscuring the invention. Note that all statements pertaining to results, such as alignment, or critical dimension figures, are to be understood as being results within a pre-selected manufacturing tolerance, since it is not possible to attain absolute precision in any practical manufacturing; rather, precision is considered as a goal within a predetermined tolerance range. Those of ordinary skill in the art, having the benefit of this disclosure, will recognize that various changes in the details, material, and arrangement of the parts and steps which have been described and illustrated may be made without departing from the principles and scope of the invention as expressed in the claims below.

We claim:

1. A method of forming a patterned field on a mask at a pre-defined critical dimension for use in photolithography, comprising:

providing a first reticle having a pattern comprising a first segment of said field, wherein said first reticle pattern contains a first predesigned pattern edge, said first reticle pattern having a first critical dimension;

exposing a mask blank at a first reduction using said first reticle to transfer said first segment onto said mask blank at a second critical dimension;

providing a second reticle having a pattern comprising a second segment of said field, wherein said second reticle pattern contains a second predesigned pattern edge, said second reticle pattern having said first critical dimension; and exposing the mask blank at a first reduction using said second reticle to transfer said second segment onto said mask blank at said second critical dimension, wherein said first and second reticle patterns are aligned at said first pattern edge and said second pattern edge to stitch the first pattern edge and the second pattern edge together.

2. A method of forming a patterned field on a mask as in claim 1, wherein said predesigned pattern edges include slanted line edges.

3. A method of forming a patterned field on a mask as in claim 2, wherein said slanted line edges comprise stair step line edges.

4. A method of forming a patterned field on a mask as in claim 1, wherein said steps of exposing the mask blank include performing a plurality of partial exposure steps to create a full exposure.

5. A method of forming a patterned field on a mask as in claim 1, wherein said mask blank includes a resonant reflective layer therein.

6. A method of forming a patterned field on a mask as in claim 5, further including the step of opening trenches within said resonant reflective layer.

* * * * *